United States Patent
Tago

(10) Patent No.: US 6,844,619 B2
(45) Date of Patent: Jan. 18, 2005

(54) COMPACT SEMICONDUCTOR DEVICE CAPABLE OF MOUNTING A PLURALITY OF SEMICONDUCTOR CHIPS WITH HIGH DENSITY AND METHOD OF MANUFACTURING THE SAME

(75) Inventor: Masamoto Tago, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/998,243

(22) Filed: Dec. 3, 2001

(65) Prior Publication Data

US 2002/0070458 A1 Jun. 13, 2002

(30) Foreign Application Priority Data

Dec. 1, 2000 (JP) ...................................... 2000-366900

(51) Int. Cl.[7] .............................................. H01L 23/02
(52) U.S. Cl. ...................................................... 257/686
(58) Field of Search ................................ 257/723, 777, 257/696, 686

(56) References Cited

U.S. PATENT DOCUMENTS

| | | | |
|---|---|---|---|
| 5,798,567 A | * 8/1998 | Kelly et al. .................. | 257/723 |
| 5,977,640 A | 11/1999 | Bertin et al. | |
| 6,084,308 A | * 7/2000 | Kelkar et al. ................ | 257/777 |
| 6,150,724 A | * 11/2000 | Wenzel et al. ................ | 257/77 |
| 6,339,254 B1 | * 1/2002 | Venkateshwaran et al. . | 257/686 |
| 6,365,975 B1 | * 4/2002 | DiStefano et al. .......... | 257/777 |
| 6,369,448 B1 | * 4/2002 | McCornick .................. | 257/777 |
| 6,396,116 B1 | * 5/2002 | Kelly et al. .................. | 257/432 |
| 6,489,687 B1 | * 12/2002 | Hashimoto .................. | 257/777 |
| 6,492,726 B1 | * 12/2002 | Quck et al. .................. | 257/723 |
| 6,507,107 B2 | * 1/2003 | Vayapuri ..................... | 257/723 |
| 6,525,414 B2 | * 2/2003 | Shiraishi et al. ............ | 257/286 |

* cited by examiner

*Primary Examiner*—David A. Zarneke
(74) *Attorney, Agent, or Firm*—Sughrue Mion, PLLC

(57) ABSTRACT

In a semiconductor device, rewirings 3 for connecting a semiconductor chip 1a, a semiconductor chip 1b and external connecting terminals 4 with each other are formed on the semiconductor chip 1a. An insulating resin 6 having opening portions in regions for forming the external connecting terminals 4 at peripheral portion of the semiconductor chip 1a and another opening portions in another region for mounting the semiconductor chip 1b at the central of the semiconductor chip 1a is overlaid on the rewirings 3. The external connecting terminals 4 consisting of BGA are formed in the opening portions of the regions for forming the external connecting terminals 4 through lands 5. The semiconductor chip 1b is connected to another opening portions of another region for mounting the semiconductor chip 1b by flip-chip structure through electrodes 11 and bumps 8. A junction surface of the bumps 8 is sealed by a sealing resin 7. The semiconductor chip 1b is mounted on the same surface as that the external connecting terminals 4 are formed. The under surface of the semiconductor chip 1b is ground in order that the semiconductor chip 1b may be shorter than the external connecting terminals 4. The semiconductor chip 1b is thereby mounted with high density.

12 Claims, 10 Drawing Sheets

COMPACT SEMICONDUCTOR DEVICE CAPABLE OF MOUNTING A PLURALITY OF SEMICONDUCTOR CHIPS WITH HIGH DENSITY AND METHOD OF MANUFACTURING THE SAME

BACKGROUND OF THE INVENTION

The present invention relates to a semiconductor device and a method of manufacturing the semiconductor device, in particular to the semiconductor device and the method of manufacturing the semiconductor device in which a plurality of semiconductor chips are stacked with high density.

As regards mounting of a semiconductor package and a semiconductor chip, it is important that the semiconductor package and the semiconductor chip are mounted in small area and capacity, but with high density, and at a low cost. For this purpose, semiconductor chips are progressively miniaturized, and Multi-Chip Module (hereunder called "MCM") method, as will later be described more in detail, is used as a method of mounting those semiconductor chips. In the MCM method, a plurality of semiconductor chips are mounted on a ceramic wiring substrate, silicon wiring substrate, and a printed wiring substrate by wire bonding or flip-chip mounting. Moreover, Multi-Chip Package (MCP) method is used as another conventional method of mounting a plurality of semiconductor chips, also as will later be described more in detail. In the MCP method, a plurality of semiconductor chips having different sizes from each other are stacked three-dimensionally and electrically connected to each other by wire bonding.

It is difficult for some different function devices, of which manufacturing processes are different from each other, to be integrated in a semiconductor chip, because of cost and technical problems. A package capable of compositing different function devices into a system, such as MCM, MCP or the like is used therefor. However, the package such as MCM or MCP has, for example, the following problems.

Namely, it becomes difficult to make the MCM package small in size and with high density. Further, manufacturing cost of the MCM package becomes high. Further, delay of electric signals is inevitably caused to occur, since wiring length becomes long in the MCM package. It is therefore difficult to obtain a desirable characteristic of high-speed operation.

On the other hand, the MCP package becomes large in thickness. As a result, the MCP package is not always suitable to be manufactured with high density. In addition, total bonding wires become so long. As a result, delay of operation speed is inevitably caused to occur due to parasitic capacitance or wiring resistance.

SUMMARY OF THE INVENTION

It is therefore an object of the present invention to provide a compact semiconductor device and a method of manufacturing the compact semiconductor device in which a plurality of semiconductor chips can be stacked with high density and connected by the electrically shortest wiring length.

It is another object of the present invention to provide a semiconductor device and a method of manufacturing the semiconductor device which can prevent increase of material cost and manufacturing cost and which is capable of mounting fine semiconductor chips firmly.

Other objects of the present invention will become clear as the description proceeds.

According to an aspect of the present invention, there is provided a semiconductor device comprising: a first semiconductor chip which has a first surface; an external connecting terminal which is formed on the first surface and which has a primary height with respect to the first surface; a second semiconductor chip which is mounted on the first surface through a bump and which has a secondary height with respect to the first surface; and the secondary height is smaller than the primary height.

According to another aspect of the present invention, there is also provided a semiconductor device comprising: a first semiconductor chip which has a first surface; an external connecting terminal which is formed on the first surface and which has a primary height with respect to the first surface; a second semiconductor chip which is mounted on the first surface through a bump and which has a secondary height with respect to the first surface; a rewiring which electrically connects the first semiconductor chip, the second semiconductor chip, and the external connecting terminal with each other and which is located on the first surface; and the second semiconductor chip being processed thin so that the secondary height being smaller than the primary height.

According to yet another aspect of the present invention, there is also provided a semiconductor device comprising: a first semiconductor chip which has a first surface; an external connecting terminal which is formed on the first surface and which has a primary height with respect to the first surface; a second semiconductor chip which is mounted on the first surface through a bump and which has a secondary height with respect to the first surface; a rewiring which electrically connects the first semiconductor chip, the second semiconductor chip, and the external connecting terminal with each other and which is located on the first surface; an insulating layer which is overlaid on the rewiring and which has predetermined opening portions in a first region for forming the external connecting terminal and in a second region for mounting the second semiconductor chip, respectively; bedding electrodes which are formed in the predetermined opening portions, respectively, the external connecting terminal being consisting of BGA and being positioned on the bedding electrode in the first region, the second semiconductor chip being flip chip bonded to the bedding electrode in the second region through the bump; and the second semiconductor chip being processed thin so that the secondary height being smaller than the primary height.

The insulating layer may be made of at least two resins of which elastic characteristics are different from each other, one resin being in the first region while another resin being in the second region.

Both the bedding electrode in the first region and the bedding electrode in the second region may be made of the same material provided in the same process.

Both the bedding electrode in the first region and the bedding electrode in the second region may be made of the same material provided in the same process.

The bedding electrode in the first region and the bedding electrode in the second region may be made of different materials from each other.

A film including a material different from that of the bedding electrode may be stacked on the bedding electrode.

The second semiconductor chip may further comprise a projection on another surface thereof opposite to a junction surface mounted to the first semiconductor chip, the projection having a ternary height with respect to the another surface of the second semiconductor chip; and the ternary height being determined so that the primary height being substantially equal to the sum of the secondary height and the ternary height.

The projection may be made of a material selected from the group consisting of metal, conductive resin, and insulating resin.

The junction surface of the second semiconductor chip mounted to the first semiconductor chip through the bump may be sealed by resin.

The semiconductor device may further comprise a resin layer which is provided on the bedding electrode in the first region and which includes via hole penetrating to the bedding electrode in the first region, and a conductor which is buried into the via hole and which electrically connects the external connecting terminal with the bedding electrode in the first region.

The first semiconductor chip may comprise a member selected from the group consisting of a semiconductor chip, a function device, and an electronic component.

The second semiconductor chip may comprise a member selected from the group consisting of a semiconductor chip, a function device, and an electronic component.

The second semiconductor chip may comprise a plurality of chips combining a member selected from the group consisting of a semiconductor chip, a function device, and an electronic component.

The second semiconductor chip may be processed thin by the use of at least one method selected from the group consisting of grinding, polishing, wet etching and dry etching.

According to still another aspect of the present invention, there is also provided a method of manufacturing a semiconductor device, the method comprising the steps of: preparing a first semiconductor chip which has a first surface; preparing an external connecting terminal which is formed on the first surface and which has a primary height with respect to the first surface; preparing a second semiconductor chip which is mounted on the first surface through a bump and which has a secondary height with respect to the first surface; and processing the second semiconductor chip thin so that the secondary height be smaller than the primary height.

According to still yet another aspect of the present invention, there is also provided a method of manufacturing a semiconductor device, the method comprising at least the steps of: preparing a first wafer on which a plurality of first semiconductor chips each having a first region for forming an external connecting terminal and a second region for mounting a second semiconductor chip; forming a rewiring which electrically connects the first semiconductor chip, the second semiconductor chip, and the external connecting terminal with each other and which is located on the first surface; overlaying an insulating layer on the rewiring; forming opening portions both in the first region for forming the external connecting terminal and in the second region for mounting the second semiconductor chip; forming bedding electrodes in the opening portions, respectively; carrying out a first processing for forming a bump on each of the second semiconductor chips and a second processing for dicing the second wafer to be divided into each of the second semiconductor chips, either the first processing and the second processing being able to be carried out previously; flip chip bonding each of the second semiconductor chips on each of the first semiconductor chips with being positioned one by one in each of the first semiconductor chips on the first wafer; sealing junction surfaces by bumps of the second semiconductor chips by resin; processing the under surface of the second semiconductor chip thin so that the secondary height be smaller than the primary height; forming the external connecting terminal of BGA on each of the first semiconductor chips on the first wafer; and dicing the first wafer to be divided into pieces.

According to further yet another aspect of the present invention, there is also provided a method of manufacturing a semiconductor device, the method comprising at least the steps of: preparing a first wafer on which a plurality of first semiconductor chips each having a first region for forming an external connecting terminal and a second region for mounting a second semiconductor chip on a first surface thereof; forming a rewiring which electrically connects the first semiconductor chip, the second semiconductor chip, and the external connecting terminal with each other and which is located on the first surface of the first semiconductor chip; overlaying an insulating layer on the rewiring; forming opening portions both in the first region for forming the external connecting terminal and in the second region for mounting the second semiconductor chip; forming bedding electrodes in the opening portions, respectively; carrying out a primary processing for forming a bump on each of the second semiconductor chips on the second wafer, a secondary processing for processing the under surface of the second semiconductor chip thin so that, after each of the second semiconductor chips is mounted on each of the first semiconductor chips, a secondary height of each of the second semiconductor chips be smaller than a primary height of the external connecting terminal both height being with respect to the first surface of the first semiconductor chip, and a ternary processing for dicing the second wafer to be divided into each of the second semiconductor chips, the primary processing, the secondary processing, and the ternary processing being able to be carried out in any order; flip chip bonding each of the second semiconductor chips on each of the first semiconductor chips with being positioned one by one in each of the first semiconductor chips on the first wafer; sealing junction surfaces by bumps of the second semiconductor chips by resin; processing the under surface of the second semiconductor chip thin so that the secondary height be smaller than the primary height; forming the external connecting terminal of BGA on each of the first semiconductor chips on the first wafer; and dicing the first wafer to be divided into pieces.

DETAILED DESCRIPTION OF THE PREFERRED EMBODIMENTS

Referring to FIGS. 1 through 4, description is, at first made about conventional semiconductor devices and methods of manufacturing the semiconductor devices in order to facilitate an understanding of the present invention.

As mentioned in the preamble of the instant specification, the MCM method is used for mounting semiconductor chips on a ceramic wiring substrate, silicon wiring substrate, and a printed wiring substrate by wire bonding or flip-chip mounting.

Figure 1:
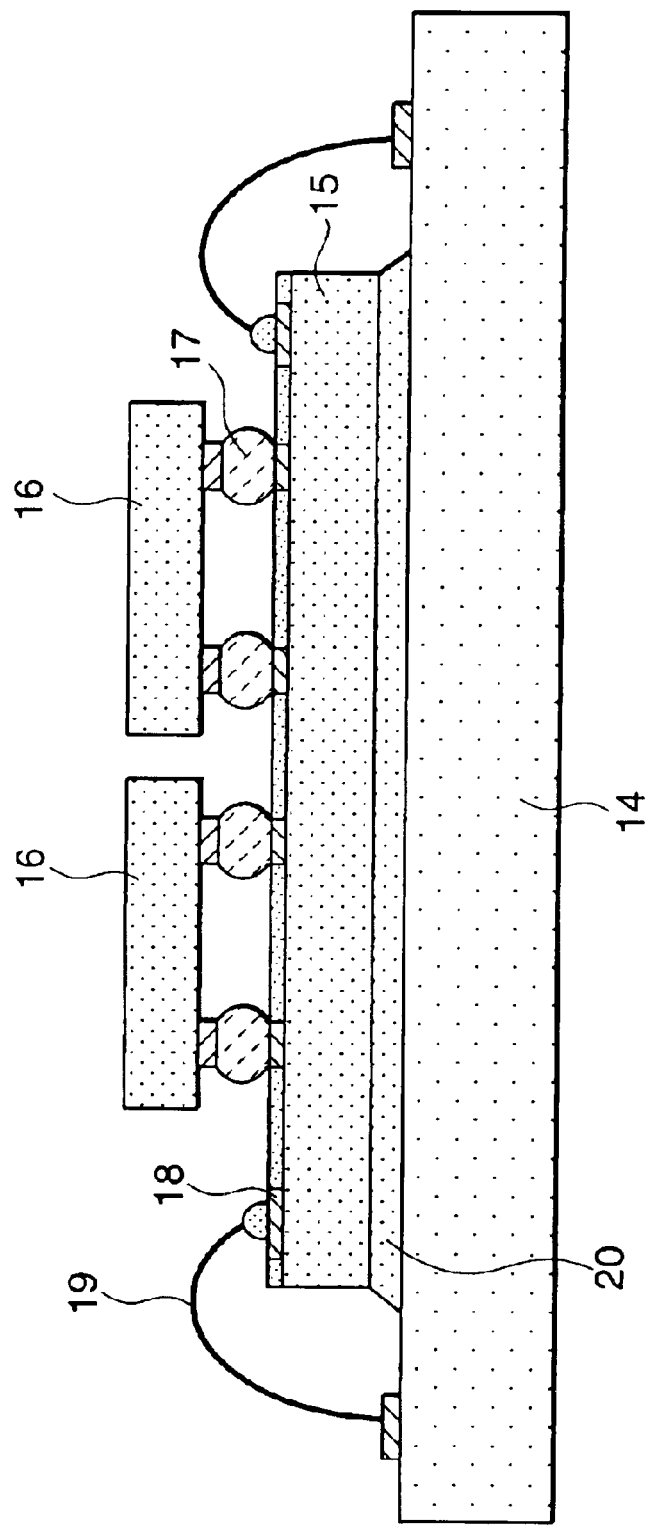
FIG. 1 is a sectional view for schematically showing a structure of a conventional MCM semiconductor device.

The MCM method is hereunder described with reference to FIG. 11 In the conventional MCM method, as illustrated in FIG. 1, semiconductor chips 16, such as LSI chips, and the like, are flatly fixed and connected onto a silicon substrate 15 by solder bumps 17. Further, the silicon substrate 15 is fixed on a mounting substrate 14 by an adhesive 20. In addition, predetermined wiring patterns 15a are formed on the silicon substrate 15. External connecting terminals 18 of the silicon substrate 15 are connected to bonding pads of the mounting substrate 14 by bonding wires 19. With the structure illustrated in FIG. 1, signals produced in the semiconductor chips 16 are transmitted therefrom to the outside by way of the solder bumps 17, the predetermined wiring patterns and the external connecting terminals 18 both on the silicon substrate 15, and the bonding wires 19.

Figure 2:
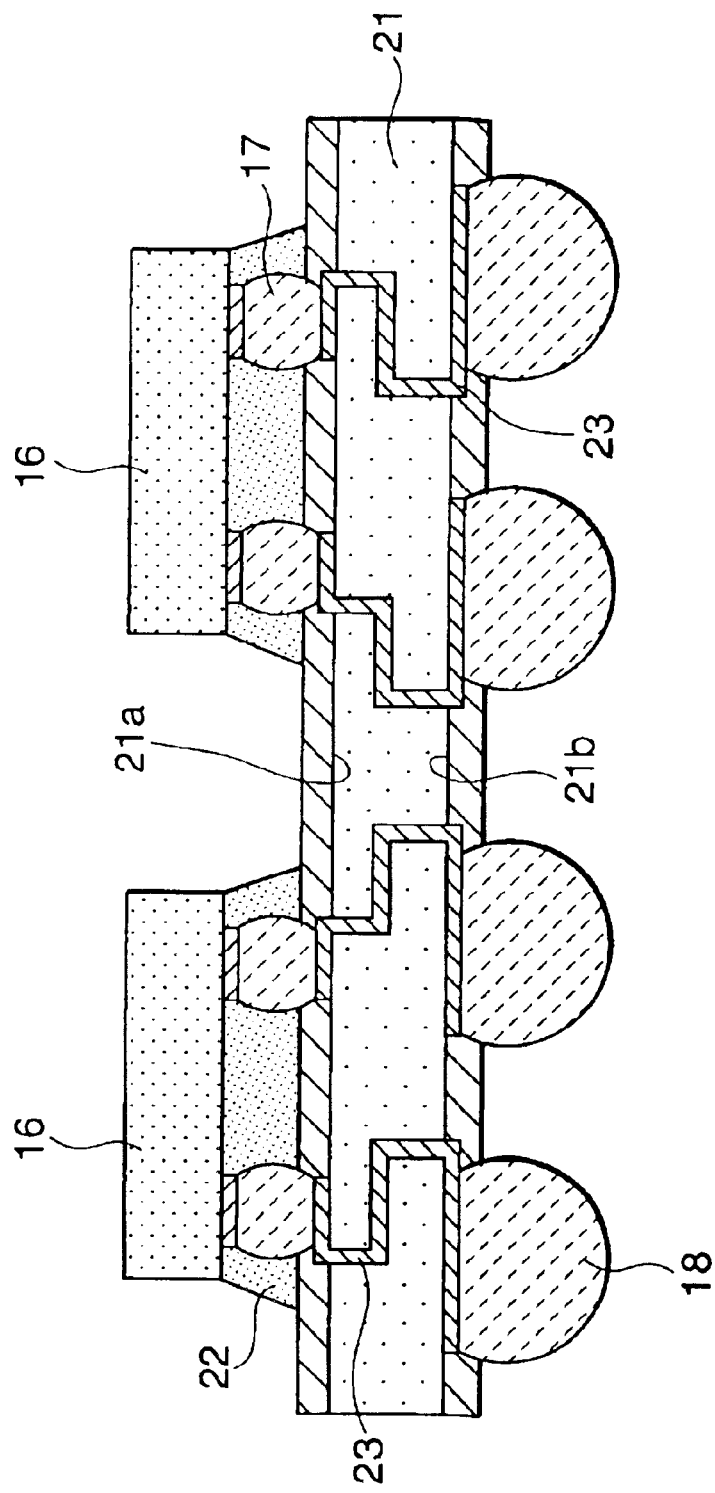
FIG. 2 is a sectional view for schematically showing a structure of another conventional MCM semiconductor device.

On the other hand, in FIG. 2, illustrated is a structure of a semiconductor device to which another conventional MCM method is applied. In the another conventional MCM method, as illustrated in FIG. 2, semiconductor chips 16 are flatly fixed and connected onto a substrate 21 by solder bumps 17. Further, junction portions by the solder bumps 17 are sealed by sealing resin 22 in order to improve reliability of junction. In addition, external connecting terminals 18 are formed on a surface 21b of the substrate 21 opposite to the surface 21a on which the semiconductor chips 16 are mounted. The external connecting terminals 18 are connected to the semiconductor chips 16 by internal wiring patterns 23 that are formed three-dimensionally within the substrate 21.

Figure 3:
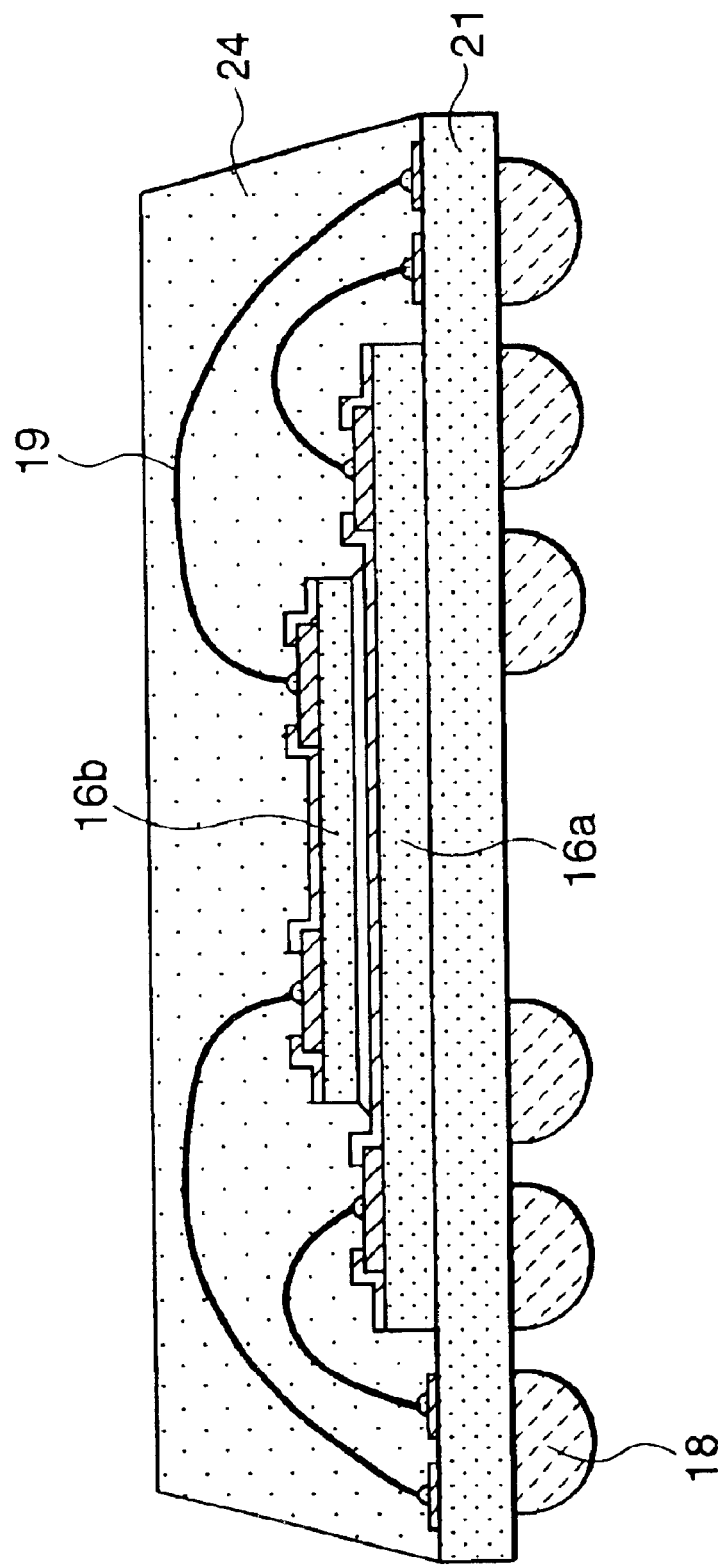
FIG. 3 is a sectional view for schematically showing a structure of a conventional MCP semiconductor device.

Moreover, yet another conventional method of mounting a plurality of semiconductor chips is Multi-Chip Package (MCP) method. In the MCP method, a plurality of semiconductor chips having different sizes from each other are stacked three-dimensionally and electrically connected to each other by wire bonding. A structure of the conventional MCP will be described with reference to FIG. 3. In FIG. 3, a semiconductor chip 16a having a larger size is fixed on the substrate 21 by an insulating paste. Further, a semiconductor chip 16b having a smaller size is fixed on the semiconductor chip 16a similarly by an insulating paste. In addition, electrode terminals of the semiconductor chips 16a and 16b are connected to the terminals on the substrate 21 by the bonding wires 19. Electric signals produced in the semiconductor chips 16a and 16b are transmitted therefrom to the outside by way of external connecting terminals 18 formed on a surface 21b of the substrate 21 opposite to the surface 21a on which the semiconductor chips 16a and 16b are mounted. Further, the semiconductor chips 16a and 16b are fixed by molding resin 24 in order that the bonding wires 19 connected three-dimensionally may be prevented from disconnection to improve reliability of connection.

Figure 4:
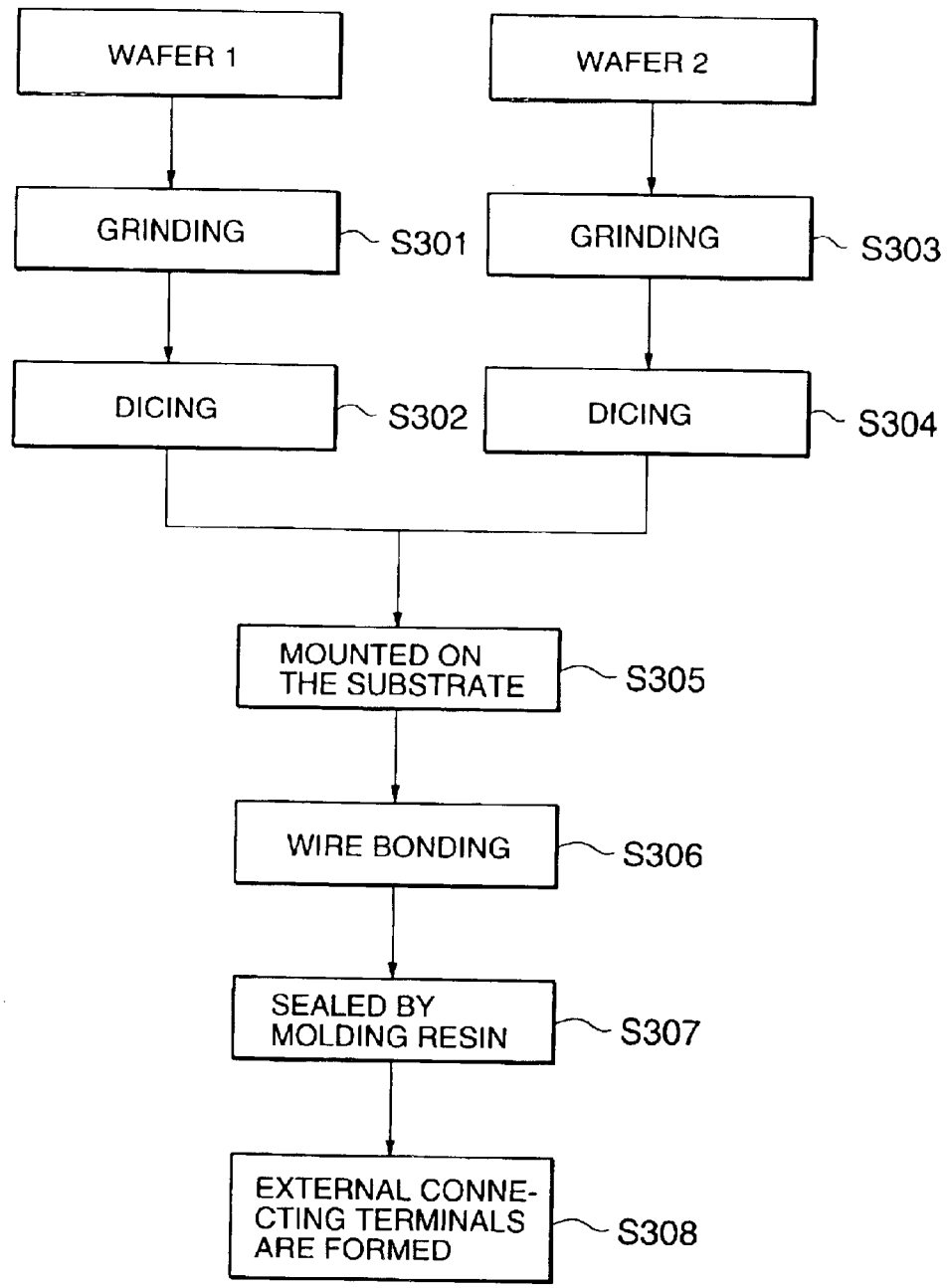
FIG. 4 is a process diagram for schematically showing a method of manufacturing the conventional MCP semiconductor device.

A method of manufacturing the conventional MCP will be described with reference to FIG. 4. As depicted in FIG. 4, the semiconductor chips 16a, 16b are, at first, formed in wafers 1, 2, respectively. Thereafter, the under surfaces of the wafers 1, 2 are ground in order that the wafers 1, 2 may have a desirable thickness, respectively (S301, S303). The wafers 1, 2 are then divided into the semiconductor chips 16a, 16b by a dicing process, respectively (S302, S304). The semiconductor chips 16a and 16b are thereafter mounted on the substrate 21 by insulating paste (S305). Further, electrode terminals of the semiconductor chips 16a and 16b are connected to the terminals on the substrate 21 by the bonding wires 19 (S306). The connected portions are then sealed by molding resin 24 (S307). Thereafter, the external connecting terminals 18 are formed on the surface 21b of the substrate 21 (S308). Accordingly, the above-mentioned MCP structure is completed.

It is difficult for some different function devices, of which manufacturing processes are different from each other, to be integrated in a semiconductor chip, because of cost and technical problems. A package capable of compounding different function devices into a system, such as MCM, MCP or the like is used therefor. However, the package such as MCM, MCP or the like has the following problems.

As regards the conventional MCM, when a printed wiring substrate of a low cost is used as a substrate for mounting the semiconductor chips 16a, 16b, it is difficult to carry out a high precision working on the printed wiring substrate. In other words, it is difficult to manufacture a substrate capable of mounting the semiconductor chips 16a, 16b of a fine pitch at a low cost. On the other hand, when the silicon substrate 15 is used as a substrate for mounting the semiconductor chips 16a, 16b, via holes cannot be formed through the silicon substrate 15. As a result, the external connecting terminals 18 cannot be formed as Ball Grid Array (BGA) type ones. Consequently, it is necessary to conduct electrical connection with the outside by wire bonding. Therefore, it becomes difficult to make the MCM small in size. Further, manufacturing cost of the silicon substrate 15 itself becomes high.

Moreover, in these MCM packages, the semiconductor chips 16a and 16b are located flatly and connected with each other on a wiring substrate. At least not only the sum of areas of the semiconductor chips 16a and 16b but also a wiring area for connecting the semiconductor chips 16a and 16b with each other are required as a mounting area. Consequently, these MCM packages are not always suitable to be manufactured small in size and with high density. Further, delay of electric signals is inevitably caused to occur, since wiring length becomes long. It is therefore difficult to obtain a desirable characteristic of high-speed operation.

On the other hand, in the conventional MCP, the semiconductor chips 16a and 16b are stacked three-dimensionally. Therefore, a mounting area in the conventional MCP can be smaller than that in the conventional MCM. However, since the semiconductor chips 16a and 16b are stacked three-dimensionally and connected by wire bonding in the conventional MCP, the MCP package, as a whole, becomes large in thickness. As a result, since a mounting volume is thus increased, the MCP package is not always suitable to be manufactured with high density. In addition, since each of the semiconductor chips 16a and 16b is connected by the bonding wire 19, total bonding wires 19 become so long. As a result, delay of operation speed is inevitably caused to occur due to parasitic capacitance or wiring resistance.

Moreover, in the method of manufacturing the MCP, the semiconductor chips 16a and 16b are processed thin in order that the MCP package may be manufactured small in size and with high density. The semiconductor chips 16a and 16b each processed thin are then mounted on the substrate 21 by an insulating paste, or the like. Thereafter, the semiconductor chips 16a and 16b mounted on the substrate 21 are subjected to the wire bonding. However, since the semiconductor chips 16a and 16b are processed thin, handling of the semiconductor chips 16a and 16b becomes hard after the above-mentioned dicing process of the wafers 1, 2. Further, the semiconductor chips 16a, 16b each processed thin have low rigidity. Therefore, curve and undulation are inevitably caused to occur in the semiconductor chips 16a and 16b, after the semiconductor chips 16a and 16b are mounted on the substrate 21 by the insulating paste. Consequently, the stacked semiconductor chips 16a and 16b are destroyed during the wire bonding process after the semiconductor chips 16a and 16b are thus mounted on the substrate 21.

In a semiconductor device of the present invention, rewirings 3 for connecting a semiconductor chip 1a, a semiconductor chip 1b and external connecting terminals 4 with each other are formed on the semiconductor chip 1a. An insulating resin 6 having opening portions in regions for forming the external connecting terminals 4 at peripheral portion of the semiconductor chip 1a and another opening portions in another region for mounting the semiconductor chip 1b at the central of the semiconductor chip 1a is overlaid on the rewirings 3. The external connecting terminals 4 consisting of BGA are formed in the opening portions of the regions for forming the external connecting terminals 4 through lands 5. The semiconductor chip 1b is connected to another opening portions of another region for mounting the semiconductor chip 1b by flip-chip structure through electrodes 11 and bumps 8. A junction surface of the bumps 8 is sealed by a sealing resin 7. The semiconductor chip 1b is mounted on the same surface as that the external connecting terminals 4 are formed. The under surface of the semiconductor chip 1b is ground in order that the semiconductor chip 1b may be shorter than the external connecting terminals 4. The semiconductor chip 1b is thereby mounted with high density.

[First Embodiment]

Figure 5:
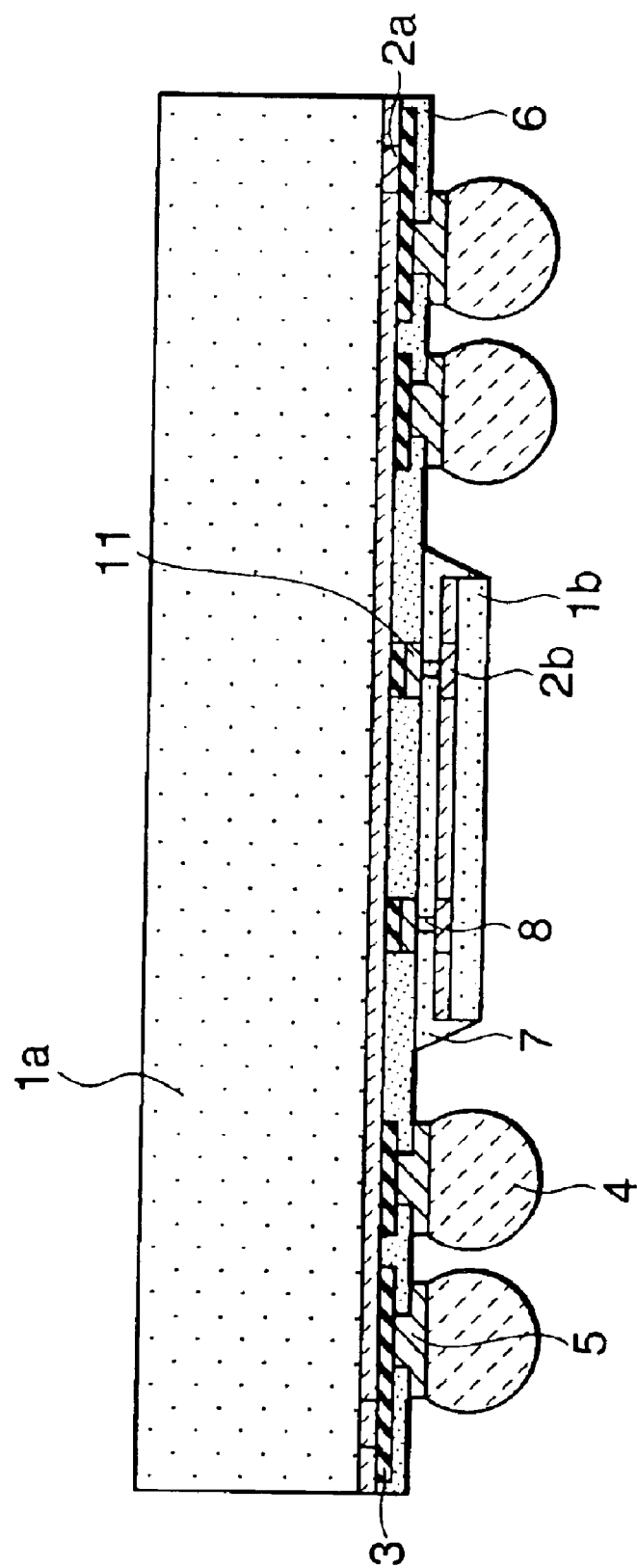
FIG. 5 is a sectional view for schematically showing a structure of a semiconductor device according to a first embodiment of the present invention.
Figure 6:
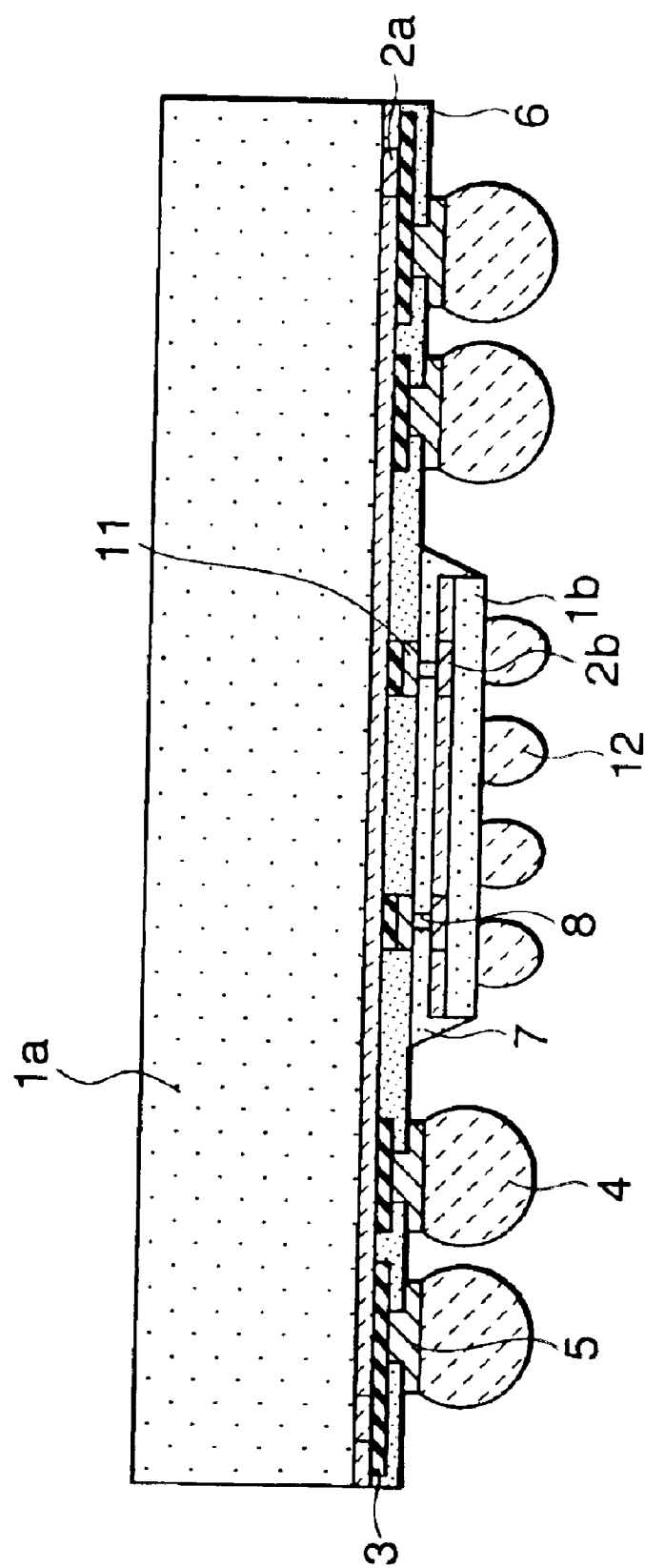
FIG. 6 is a sectional view for schematically showing a structure of the semiconductor device according to the first embodiment of the present invention.

Now, referring to FIGS. 5 and 6, description will proceed to semiconductor devices according to a first embodiment of the present invention. FIG. 5 is a sectional view for schematically showing a structure of a semiconductor device according to the first embodiment of the present invention.

In FIG. 5, the semiconductor device according to the first embodiment of the present invention comprises a semiconductor chip 1a. As illustrated in FIG. 5, rewirings 3 for connecting a semiconductor chip 1a and external connecting terminals 4, a semiconductor chip 1a and a semiconductor chip 1b, a semiconductor chip 1b and external connecting terminals 4, a semiconductor chip 1a, a semiconductor chip 1b, and external connecting terminals 4 with each other, respectively, are formed on the semiconductor chip 1a. The rewirings 3 are insulated by an insulating resin 6 having predetermined opening portions. The external connecting terminals 4 consisting of BGA are formed in the opening portions at peripheral regions of the semiconductor chip 1a through lands 5. On the other hand, the semiconductor chip 1b is mounted on the central portion of the semiconductor chip 1a by bumps 8 through electrodes 11. The external connecting terminals 4 consisting of BGA are formed on the lands 5, as mentioned above. Further, the semiconductor chip 1b is processed thin in order that height of the semiconductor chip 1b may be sufficiently smaller than height of the external connecting terminals 4. In addition, a junction surface of the bumps 8 is sealed by a sealing resin 7.

Herein, in this embodiment, such a wafer having a thickness of approximately 625 μm generally used as an unground wafer is used for the semiconductor chip 1a. On the other hand, the semiconductor chip 1b has a thickness of approximately 100 μm.

In the interim, a curve is generated in the semiconductor chip 1b by a temperature cycle while another curve is also generated in the semiconductor chip 1a by the same temperature cycle. However, when the semiconductor chip 1b is thin enough, the curve generated in the semiconductor chip 1b is adjusted to the another curve generated in the semiconductor chip 1a. Consequently, stress generated in a connected portion by bumps or a sealing resin layer can be lightened in the semiconductor device according to this embodiment. Accordingly, the smaller the thickness of the semiconductor chip 1b becomes, the more preferable the semiconductor chip 1b is. Namely, height of the semiconductor chip 1b is smaller than that of the external connecting terminals 4 on a condition that the semiconductor chip 1b is fixed on the semiconductor chip 1a. Within the range, the semiconductor chip 1b can be provided to have a voluntary thickness, such as 50 μm, 30 μm, or the like. Further, the semiconductor chip 1b can be formed to have a thickness of approximately 10 μm, if capable of being ground, and unless characteristic of the semiconductor chip 1b is damaged. On the other hand, a thickness of the semiconductor chip 1a is not restricted to the above-mentioned 625 μm. The semiconductor chip 1a can be provided to have a voluntary thickness in view of handling, strength, or the like of the semiconductor chip 1a. For example, the semiconductor chip 1a can be formed to have a thickness of 500 μm, 400 μm, or the like that is obtained by grinding the above-mentioned unground wafer.

Herein, referring to FIG. 6, description proceeds to a semiconductor device according to a variation of the first embodiment of the present invention. FIG. 6 is a sectional view for schematically showing a structure of the semiconductor device according to the variation of the first embodiment of the present invention.

In this variation of the first embodiment, as illustrated in FIG. 6, in order to further enhance not only connection strength between a mother board and the semiconductor device having the semiconductor chips 1a and 1b fixed to each other but also radiation effect, or the like, a plurality of projections 12 are located on the under surface of the semiconductor chip 1b processed thin. The projections 12 are adjusted to have the same height as that of the external connecting terminals 4. The projections 12 as well as the external connecting terminals 4 come into contact with the motherboard, when the semiconductor device is mounted on the motherboard.

By the projections 12, the radiation effect for radiating heat generated by the semiconductor chip 1b is enhanced, compared with the semiconductor device illustrated in FIG. 5. As a result, ground potential is strengthened. In addition, when the semiconductor device is mounted on the motherboard, the projections 12 reinforce the connection between the semiconductor device and the motherboard. In this variation of the first embodiment, solder is used as a material of the projections 12, likewise with the material of the external connecting terminals 4. However, any other metallic materials and conductive resin materials can be alternatively used as the material of the projections 12. On the contrary, insulating resin materials can also be used as the material of the projections 12. In this case, ground potential is not strengthened. However, the projections 12 made of insulating resin sufficiently bring not only the radiation effect but also the above-mentioned effect of reinforcing the connection between the semiconductor device and the motherboard. These effects can be obtained, even if the members corresponding to the projections 12 are not such projections. The members corresponding to the projections 12 can be configured, dependent on use thereof. Those effects can be obtained, even if the members corresponding to the projections 12 are connected to the semiconductor device and the motherboard by the whole surface of the members.

In the above-mentioned semiconductor devices illustrated in FIGS. 5 and 6, the rewirings 3 are formed during a wiring process using aluminum or copper on a wafer, so that manufacturing processes of the semiconductor devices can be prevented from being complicated. Further, the insulating resin 6 is made of polyimide or epoxy resin of low elasticity, so that insulating effect, heat resistance and misture resistance are obtained. In addition, the sealing resin 7 is preferably made of epoxy resin of which the expansion rate is adjusted to those of the bumps 8 and the semiconductor chip 1b, in order to protect a junction portion between the semiconductor chip 1b and the bumps 8. However, the sealing resin 7 can be made of the same material as that of the insulating resin 6, in a case that strength of the junction portion is sufficiently maintained.

In the first embodiment, the insulating resin 6 overlaying the rewirings 3 is formed uniformly on a whole of the substrate (semiconductor chip 1a). Alternatively, insulating resins having different material characteristics from each other can be formed on an area in which the external connecting terminals 4 are located, another area on which the semiconductor chip 1b is mounted, respectively. For example, an insulating resin of lower elasticity can be formed on the area in which the external connecting terminals 4 are located, compared with that of another insulating resin formed on the another area on which the semiconductor chip 1b is mounted. With this structure, stress generated in the bumps 8 or the semiconductor chip 1b can be more lightened.

Further, in the first embodiment, the electrodes 11 for connecting the bumps 8 are formed in predetermined positions of the semiconductor chip 1a on which the semiconductor chip 1b is mounted. The electrodes 11 are formed at the same time when the lands 5 of the external connecting terminals 4 are formed. In addition, the electrodes 11 as well as the lands 5 are made of the same materials, namely, of an electrode member consisting of gold-plated nickel. However, the electrodes 11 and the lands 5 can be made of different materials from each other, in a case that junction strength with the bumps 8 are desired to be increased or that solder is overlaid on the electrodes 11.

Besides, in the first embodiment, description was made about the semiconductor device in which the semiconductor chip 1b was mounted at the central portion of the semiconductor chip 1a. However, the present invention is not restricted to such a structure. For example, more than two chips each having a function equal to that of a semiconductor chip can be mounted on the semiconductor device of the present invention. Further, more than two chips having different functions from each other can also be mounted on the semiconductor device of the present invention. In these cases, positions in which the chips are mounted can be determined voluntarily.

[Second Embodiment]

Figure 7:
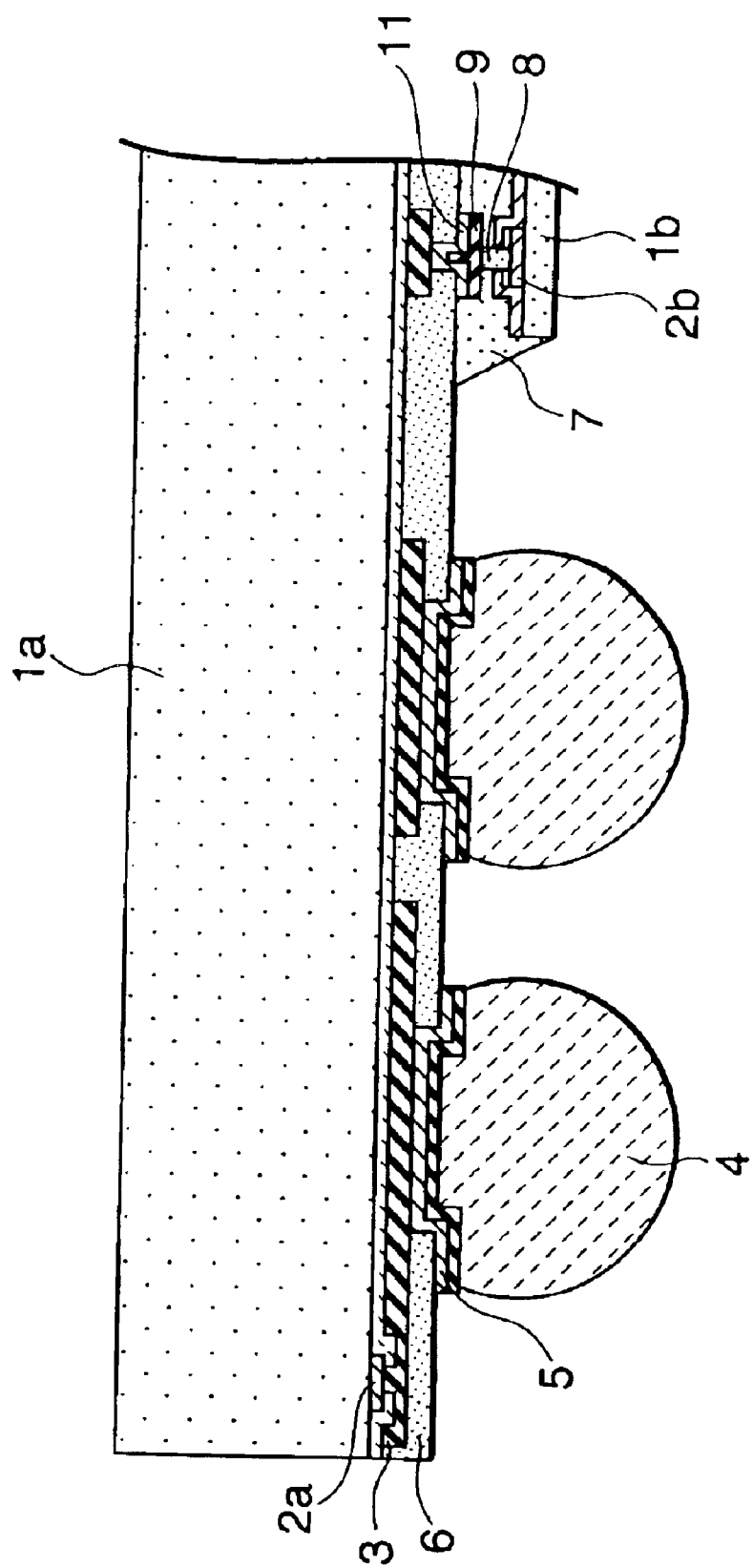
FIG. 7 is an enlarged sectional view for schematically showing a structure of a part of a semiconductor device according to a second embodiment of the present invention.
Figure 8:
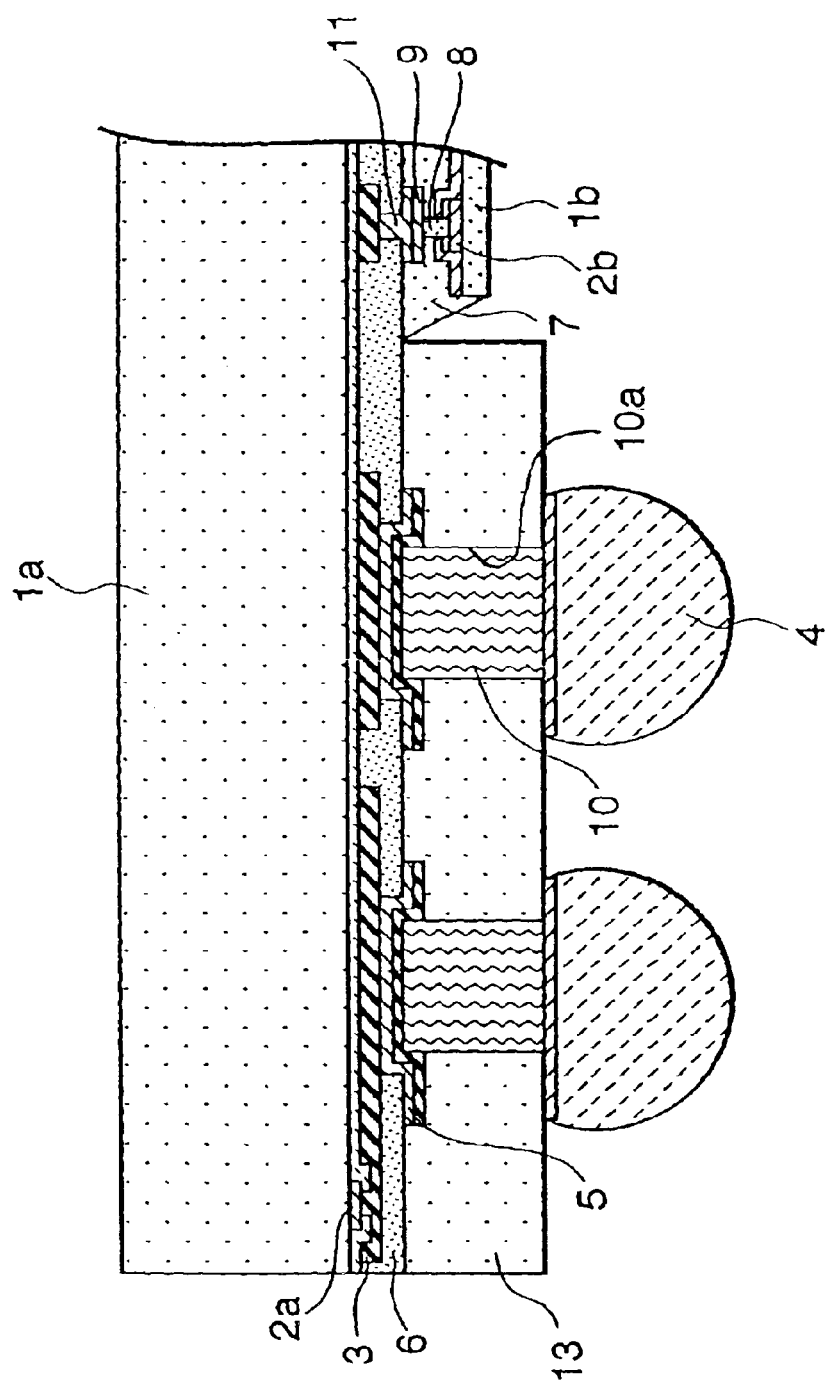
FIG. 8 is an enlarged sectional view for schematically showing a structure of a part of the semiconductor device according to the second embodiment of the present invention.

Next, referring to FIGS. 7 and 8, description will proceed to semiconductor devices according to a second embodiment of the present invention. FIG. 7 is an enlarged sectional view for schematically showing a structure of a part of a semiconductor device according to the second embodiment of the present invention. The semiconductor device according to this embodiment has a constitution basically similar to that of the first embodiment except that the structures of the lands and the electrodes 11 are improved. Similar portions are designated by like reference numerals.

At first, a structure illustrated in FIG. 7 is described as regards the semiconductor device according to this embodiment. As illustrated in FIG. 7, in the semiconductor device according to the second embodiment of the present invention, rewirings 3 are formed on a semiconductor chip 1a. The rewirings 3 are overlaid by an insulating resin 6. In the insulating resin 6, opening portions are formed not only at a position in which external connecting terminals 4 are formed but also at another position corresponding to bumps 8 for mounting a semiconductor chip 1b. Further, lands 5 and electrodes 11 are formed, as a whole, by a material well adhesive to both the rewirings 3 and the external connecting terminals 4 of solder bumps. In addition, junction layers 9 are formed on the electrodes 11, so that adhesion of the semiconductor chip 1a to the bumps 8 formed on the semiconductor chip 1b is enhanced. On a condition that the adhesion is enhanced, the semiconductor chip 1b is mounted on the semiconductor chip 1a. Further, junction surfaces between the junction layers 9 and the bumps 8 are sealed by sealing resin 7.

Some combinations of materials of the junction layers 9 and the bumps 8 can be considered. Namely, the junction layers 9 can be made of plated gold while the bumps 8 can be made of gold-plated bump or gold-stud bump. Further, the junction layers 9 can be made of tin solder or tin alloy solder while the bumps 8 can be made of gold-plated bump, gold-stud bump, copper-plated bump, or copper-plated bump overlaid by tin or tin alloy.

As mentioned above, the junction layers 9 are formed on the electrodes 11. However, in a case that a material for forming the lands 5 is well adhesive to the bumps 8, the junction layers 9 can be omitted. In this case, cost for manufacturing the semiconductor device can be further reduced. On the other hand, in a case that the junction layers 9 are formed on the electrodes 11, an electrode-type chip and general wirings by wire bonding can be used as the semiconductor chip 1b. It is therefore not necessary to exclusively design the semiconductor chip 1b. A semiconductor package can be designed and manufactured at a low cost.

Herein, referring to FIG. 8, description proceeds to a semiconductor device according to a variation of the second embodiment of the present invention. FIG. 8 is an enlarged sectional view for schematically showing a structure of a part of the semiconductor device according to the variation of the second embodiment of the present invention.

A structure illustrated in FIG. 8 is considered so as to lighten stress generated in the semiconductor device. In this variation of the second embodiment, similarly to the semiconductor device illustrated in FIG. 7, rewirings 3 are formed on a semiconductor chip 1a. The rewirings 3 are overlaid by an insulating resin 6. In the insulating resin 6, opening portions are formed at predetermined positions. Further, lands 5 are formed in the opening portions. However, in the structure illustrated in FIG. 8, another insulating resin 13 is formed over the regions of the lands 5 to have a predetermined thickness. Further, via holes 10A penetrating to the lands 5 are formed. Conductors are buried into the via holes 10A to form via 10. With the structure being illustrated, the via 10 can be made small in diameter so that the diameter of the via 10 may be not larger than one half of a diameter of each land 5. The via 10 bring advantageous effect that the stress generated in the semiconductor device is lightened. The via 10 are thereby capable of elongating life of the semiconductor device. The height of the external connecting terminals 4 can be adjusted by the via 10, even if it is difficult to make the semiconductor chip 1b thin.

For example, according to an experiment by the inventor of the present invention, when pitches of the external connecting terminals 4 are approximately 200 μm, the diameter of each land 5 becomes from approximately 120 μm to approximately 100 μm. Further, it has been confirmed by simulation test that the life of the semiconductor device was elongated not shorter than two times thereof by making the diameter of the via 10 be approximately 50 μm. In this case, the via 10 is insulated by the another insulating resin 13 of low elasticity to be protected thereby. Consequently, the above-mentioned effect that the life of the semiconductor device was thus elongated can be obtained.

In the above-mentioned description, the diameter of the via 10 was approximately 50 μm and smaller than the diameter of each land 5. Alternatively, the diameter of the via 10 may be substantially equal to the diameter of each land 5. In this case, however, junction strength between the via 10 and the rewirings 3 must be high. Further, reliability can be maintained by making elasticity of the another insulating resin 13 be substantially equal to elasticity of the semiconductor chip 1a.

[Third Embodiment]

Figure 9:
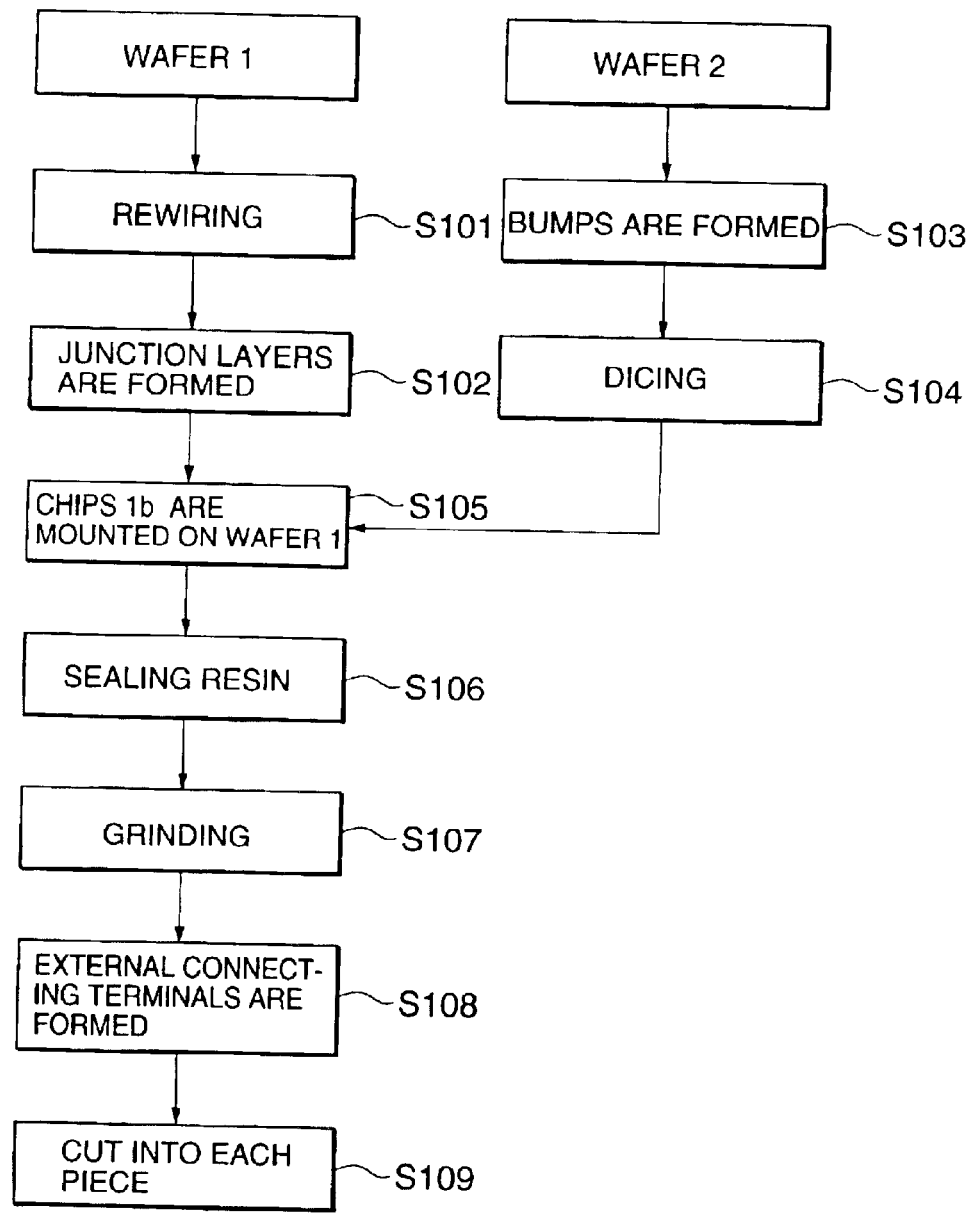
FIG. 9 is a process diagram for schematically showing a method of manufacturing a semiconductor device according to a third embodiment of the present invention.
Figure 10:
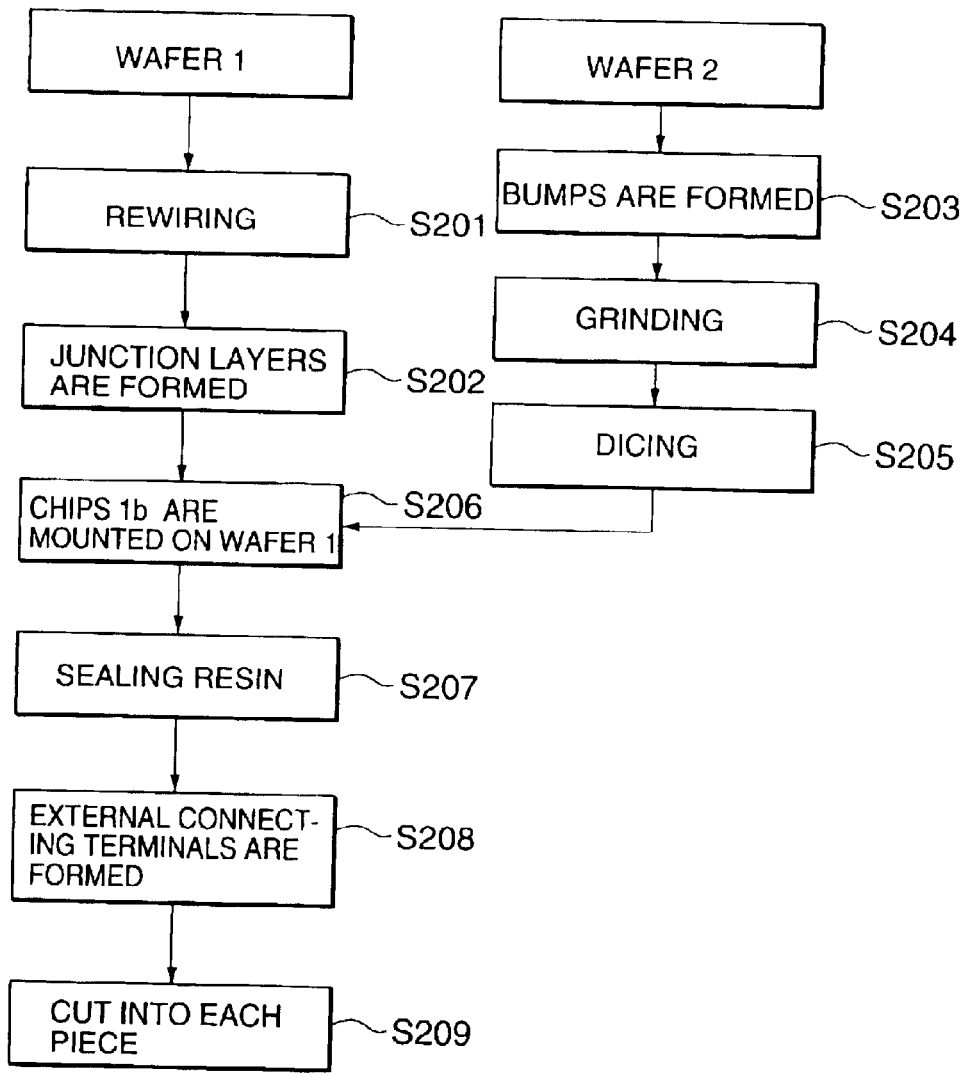
FIG. 10 is a process diagram for schematically showing a method of manufacturing the semiconductor device according to the third embodiment of the present invention.

Next, referring to FIGS. 9 and 10, description will proceed to methods of manufacturing semiconductor devices according to a third embodiment of the present invention. FIGS. 9 and 10 are flowcharts for schematically showing the methods of manufacturing the semiconductor devices according to the third embodiment of the present invention. Besides, description of the third embodiment is made as regards methods of manufacturing semiconductor devices of the first and the second embodiments mentioned before.

At first, referring to FIG. 9 with reference to FIGS. 5 and 6 continued, description is made about the method of manufacturing the semiconductor device according to the third embodiment. As depicted in FIG. 9, the semiconductor chips 1a, 1b are, at first, formed in wafers 1, 2, respectively. Thereafter, the rewirings 3 for connecting the semiconductor chip 1a, the semiconductor chip 1b and the external connecting terminals 4 with each other are formed on the wafer 1 (S101). The insulating resin 6 is applied on the rewirings 3 and the semiconductor chip 1a in the wafer 1. Thereafter, predetermined opening portions are formed in the insulating resin 6. The lands 5 and the electrodes 11 are formed in the opening portions. Further, the junction layers 9 depicted in the second embodiment are formed on the electrodes 11 as the occasion demands (S102). On the other hand, the bumps 8 to which the semiconductor chip 1a is connected are formed in the wafer 2 (S103). The wafer 2 is thereafter subjected to dicing to be divided into semiconductor chips 1b (S104).

Next, desirable numbers of the semiconductor chips 1b each having the bumps 8 formed therein are flip chip bonded to predetermined positions of the wafer 1 with one by one being positioned on each predetermined position of the wafer 1 (S105). Thereafter, the sealing resin 7 is injected into the junction surfaces of the bumps 8 to be hardened (S106). After the sealing resin 7 is thus hardened, the under surfaces of the semiconductor chips 1b each mounted on the wafer 1 are ground so that each semiconductor chip 1b may have a predetermined thickness (S107). After finishing the grinding process, the external connecting terminals 4 are formed on the lands 5 (S108). The wafer 1 is then cut into each piece so that the piece may form a configuration of the semiconductor device. The semiconductor devices are obtained accordingly (S109). Herein, the bumps 8 are formed on the semiconductor chips 1b on the condition that the semiconductor chips 1b are included in the wafer 2. In this case, the bumps 8 are formed by the use of plating method or stud bump method. On the other hand, the bumps 8 can alternatively be formed on each of the semiconductor chips 1b after the dicing. In the case, the bumps 8 are formed by the use of stud bump method.

Furthermore, referring to FIG. 10 with reference to FIGS. 5 and 6 continued, description is made about another method of manufacturing the semiconductor device according to the variation of the third embodiment. As depicted in FIG. 10, at first, similarly to the above-mentioned method, the semiconductor chips 1a, 1b are formed in the wafers 1, 2, respectively. Thereafter, the rewirings 3 for connecting the semiconductor chip 1a, the semiconductor chip 1b and the external connecting terminals 4 with each other are formed on the wafer 1 (S201). The insulating resin 6 is applied on the rewirings 3 and the semiconductor chip 1a in the wafer 1. Thereafter, predetermined opening portions are formed in the insulating resin 6. The lands 5 and the electrodes 11 are formed in the opening portions. Further, the junction layers 9 depicted in the second embodiment are formed on the electrodes 11 as the occasion demands (S202). On the other hand, the bumps 8 to which the semiconductor chip 1a is connected are formed in the wafer 2 (S203) In this method depicted in FIG. 10, the under surface of the wafer 2 is then ground so that the wafer 2 may have a desirable thickness (S204). Thereafter, the wafer 2 is subjected to dicing to be divided into semiconductor chips 1b each having a predetermined size (S205).

Next, desirable numbers of the semiconductor chips 1b each processed thin are flip chip bonded to predetermined positions of the wafer 1 with one by one being positioned on each predetermined position of the wafer 1 (S206). Thereafter, the sealing resin 7 is injected into the junction surfaces of the bumps 8 to be hardened (S207). After the sealing resin 7 is thus hardened, the external connecting terminals 4 are formed on the lands 5 (S208). The wafer 1 is then cut into each piece so that the piece may form a configuration of the semiconductor device. The semiconductor devices are obtained accordingly (S209).

The two methods depicted in FIGS. 9 and 10 have merits and demerits, respectively. For example, in the method depicted in FIG. 9, the semiconductor chips 1b divided by the dicing are handled to be mounted on the wafer 1 before the semiconductor chips 1b are processed thin. A merit that handling operation becomes easy is obtained. However, the semiconductor chips 1b are ground, as a whole, after the semiconductor chips 1b have been mounted on the wafer 1. A demerit is caused to occur, that is, unevenness is generated in thickness of the semiconductor chips 1b, due to the curve of the wafer 1, junction condition by the bumps 8, an influence of working precision of a grinding apparatus, or the like. On the other hand, in the method depicted in FIG. 10, the semiconductor chips 1b are ground on the condition that the semiconductor chips 1b are included in the wafer 2. Consequently, unevenness generated in thickness of the semiconductor chips 1b can be reduced. A demerit is caused to occur, that is, the semiconductor chips 1b must be handled to be mounted on the wafer 1 on the condition that each semiconductor chip 1b is processed thin. The handling operation is therefore deteriorated. In view of manufacturing conditions, performance of a manufacturing apparatus, yield, or the like, it can be determined as the occasion demands whether either the method depicted in FIG. 9 or the method depicted in FIG. 10 is selected.

Besides, in the method mentioned above, after the bumps 8 are formed in the wafer 2 at S103, the wafer 2 is subjected to the dicing at S104. These steps can be reversed alternatively. Namely, the bumps 8 can be formed in each semiconductor chip 1b, after the wafer 2 has been processed in the dicing. In the second embodiment mentioned before, the via 10 are formed to lighten the stress generated in the semiconductor device after the lands 5 are formed. In such a case, after the under surfaces of the semiconductor chips 1b each mounted on the wafer 1 are ground at S107, or after the semiconductor chips 1b are sealed by the sealing resin 7 at S207, the via 10 can be formed before the external connecting terminals 4 are formed at S108 (S208). The via 10 can be formed generally by the use of plating. Alternatively, an array or a group of the via 10 fixed to a sheet-like insulating resin 13 can be applied to the semiconductor chip 1a by the use of methods, such as thermo compression bonding, or the like, so as to form the via 10.

As mentioned above, the following meritorious effects can be obtained by the present invention.

First, in mounting a plurality of semiconductor chips, mounting area and volume can be made small. Further, in each of the semiconductor chips, electrical connection can be achieved by the electrically shortest wiring length.

The reason is that, without using a mounting substrate, rewirings are provided on one semiconductor chip 1a, that external connecting terminals 4 as well as another semiconductor chip 1b processed thin enough to be sufficiently shorter than the external connecting terminals 4 of BGA are provided on the same surface of the semiconductor chip 1a, and that the semiconductor chip 1a, the semiconductor chip 1b and the external connecting terminals 4 are connected with each other by the rewirings 3.

Second, a plurality of metallic projections are located on the under surface of the semiconductor chip 1b connected to the semiconductor chip 1a. The radiation effect for radiating heat generated by the semiconductor chip 1b is enhanced. The ground potential is then strengthened. In addition, when the semiconductor device is mounted on the motherboard, the metallic projections reinforce the connection between the semiconductor device and the motherboard.

Third, since the rewirings can be formed in a process on a wafer without using a mounting substrate, precision of dimension is high in the semiconductor device. Further, the semiconductor device is thereby suitable to be made as fine pattern. Moreover, material cost can be thereby reduced.

Fourth, after the semiconductor chips 1b are mounted on the semiconductor chip 1a, the under surfaces of the semiconductor chips 1b are ground so that each semiconductor chip 1b may be processed thin. It is not necessary to handle each thin semiconductor chip 1b. The handling operation can therefore be improved. Moreover, numbers of processes can be reduced in the method, compared with the conventional method. Accordingly, manufacturing cost can also be reduced.

While this invention has thus far been described in conjunction with several embodiments thereof, it will now be readily possible for one skilled in the art to put this invention into effect in various other manners. For example, only two methods are described in the third embodiment. However, the method of manufacturing a semiconductor device according to the present invention is not restricted to the two methods. Any methods can be alternatively used, if the methods can realize a structure of the semiconductor device of the first and the second embodiments. For example, replaced with grinding, a method of wet etching, dry etching, polishing, or the like can be used. Further, the external connecting terminals 4 can be formed higher (taller) without grinding the wafer 2 to be thin.

What is claimed is:

1. A semiconductor device comprising:
    a first semiconductor chip which has a first surface;
    an external connecting terminal which is formed on said first surface, said external connecting terminal having a primary height with respect to said first surface;
    a second semiconductor chip which is mounted on said first surface through a bump, said second semiconductor chip having a secondary height with respect to said first surface;
    a rewiring which electrically connects said first semiconductor chip, said second semiconductor chip, and said external connecting terminal with each other and which is located on said first surface;
    an insulating layer which is overlaid on said rewiring and which has predetermined opening portions in a first region for forming said external connecting terminal and in a second region for mounting said second semiconductor chip, respectively; and
    bedding electrodes which are formed in said predetermined opening portions respectively, said external connecting terminal comprising BGA and being positioned on said bedding electrode in said first region, said second semiconductor chip being flip chip bonded to said bedding electrode in said second region through said bump,
    wherein said second semiconductor chip is thin whereby said secondary height is smaller than said primary height.

2. A semiconductor device as claimed in claim 1, wherein said insulating layer is made of at least two resins of which elastic characteristics are different from each other, one resin being in said first region while another resin being in said second region.

3. A semiconductor device as claimed in claim 1, wherein both said bedding electrode in said first region and said bedding electrode in said second region are made of the same material provided in the same process.

4. A semiconductor device as claimed in claim 2, wherein both said bedding electrode in said first region and said bedding electrode in said second region are made of the same material provided in the same process.

5. A semiconductor device as claimed in claim 1, wherein said bedding electrode in said first region and said bedding electrode in said second region are made of different materials from each other.

6. A semiconductor device as claimed in claim 2, wherein said bedding electrode in said first region and said bedding electrode in said second region are made of different materials from each other.

7. A semiconductor device as claimed in claim 4, wherein a film including a material different from that of said bedding electrode is stacked on said bedding electrode.

8. A semiconductor device as claimed in claim 6, wherein a film including a material different from that of said bedding electrode is stacked on said bedding electrode.

9. A semiconductor device comprising:

a first semiconductor chip which has a first surface;

an external connecting terminal which is formed on said first surface, said external connecting terminal having a primary height with respect to said first surface;

a second semiconductor chip which is mounted on said first surface, wherein said second semiconductor chip has a secondary height with respect to said first surface; and said secondary height is smaller than said primary height, wherein said second semiconductor chip further comprises a projection on another surface thereof opposite to a junction surface mounted to said first semiconductor chip, said projection having a ternary height with respect to said another surface of said second semiconductor chip; and said ternary height being determined so that said primary height being substantially equal to the sum of said secondary height and said ternary height.

10. A semiconductor device as claimed in claim 9, wherein said projection is made of a material selected from the group consisting of metal, conductive resin, and insulating resin.

11. A semiconductor device as claimed in claim 9, wherein said junction surface of said second semiconductor chip mounted to said first semiconductor chip through said bump is sealed by resin.

12. A semiconductor device as claimed in claim 1, further comprising a resin layer which is provided on said bedding electrode in said first region and which includes via hole penetrating to the bedding electrode in said first region, and a conductor which is buried into said via hole and which electrically connects said external connecting terminal with the bedding electrode in said first region.

* * * * *

UNITED STATES PATENT AND TRADEMARK OFFICE
CERTIFICATE OF CORRECTION

PATENT NO.    : 6,844,619 B2  
DATED         : January 18, 2005  
INVENTOR(S)   : Masamoto Tago It is certified that error appears in the above-identified patent and that said Letters Patent is hereby corrected as shown below:

Column 5,
Line 3, after "to" insert -- a variation of --;

Column 8,
Lines 11-12, between "resin 7." and "Herein," insert -- Electrode pads 2a and 2b are also shown in Fig. 5. --.

Signed and Sealed this

Fourth Day of April, 2006

JON W. DUDAS  
*Director of the United States Patent and Trademark Office*